United States Patent
Kemmochi et al.

(10) Patent No.: US 6,510,707 B2
(45) Date of Patent: Jan. 28, 2003

(54) METHODS FOR MAKING SILICA CRUCIBLES

(75) Inventors: Katsuhiko Kemmochi, Vancouver, WA (US); Takayuki Togawa, Hiraide Takefu (JP); Robert Mosier, Vancouver, WA (US); Paul Spencer, Stevenson, WA (US)

(73) Assignee: Heraeus Shin-Etsu America, Inc., Camas, WA (US)

( * ) Notice: Subject to any disclaimer, the term of this patent is extended or adjusted under 35 U.S.C. 154(b) by 0 days.

(21) Appl. No.: 09/808,719

(22) Filed: Mar. 15, 2001

(65) Prior Publication Data

US 2002/0166340 A1 Nov. 14, 2002

(51) Int. Cl.$^7$ ................................................ C03B 20/00
(52) U.S. Cl. ................................ 65/17.3; 65/17.6; 65/23; 65/31
(58) Field of Search ................................ 65/17.3, 17.4, 65/17.5, 17.6, 23, 31

(56) References Cited

U.S. PATENT DOCUMENTS

| | | | | |
|---|---|---|---|---|
| 4,102,664 A | * | 7/1978 | Dumbaugh, Jr. | 216/33 |
| 4,116,657 A | * | 9/1978 | Elmer | 65/117 |
| 4,416,680 A | | 11/1983 | Bruning et al. | |
| 4,528,163 A | | 7/1985 | Albrecht | |
| 4,572,729 A | * | 2/1986 | Lang et al. | 264/600 |
| 4,632,686 A | * | 12/1986 | Brown et al. | 264/101 |
| 4,713,104 A | * | 12/1987 | Brown et al. | 65/144 |
| 4,874,417 A | | 10/1989 | Winterburn | |
| 4,880,453 A | * | 11/1989 | Coppola et al. | 216/34 |
| 4,935,046 A | | 6/1990 | Uchikawa et al. | |
| 4,956,208 A | | 9/1990 | Uchikawa et al. | |
| 5,100,452 A | * | 3/1992 | Dumbaugh, Jr. | 156/155 |
| 5,174,801 A | * | 12/1992 | Matsumura et al. | 65/144 |
| 5,342,426 A | * | 8/1994 | Dumbaugh, Jr. | 216/97 |
| 5,536,292 A | * | 7/1996 | Holcombe et al. | 252/62 |
| 5,637,284 A | | 6/1997 | Sato et al. | |
| 5,676,720 A | * | 10/1997 | Ducheyne et al. | 65/17.3 |
| 5,762,672 A | * | 6/1998 | Ikeda et al. | 65/144 |
| 5,885,071 A | * | 3/1999 | Watanabe et al. | 428/34.1 |
| 5,895,527 A | * | 4/1999 | Taguchi et al. | 117/200 |
| 5,976,247 A | | 11/1999 | Hansen et al. | |

FOREIGN PATENT DOCUMENTS

| | | |
|---|---|---|
| JP | 63166791 | 7/1988 |
| JP | 1197381 | 8/1989 |
| JP | 1197382 | 8/1989 |
| JP | 7196397 | 8/1995 |

* cited by examiner

Primary Examiner—Sean Vincent
(74) Attorney, Agent, or Firm—Kenneth E. Horton; Rader, Fishman & Grauer PLLC

(57) ABSTRACT

Silica crucibles containing an inner layer which is substantially pure and substantially bubble-free and methods for making such crucibles. The inner layer is also substantially stable against roughening and spot devitrification. The inner layer is formed by making a web structure which is then converted to a continuous layer, thereby minimizing or eliminating bubble formation. The inner layer is also formed using a gettering agent which getters alkaline and alkaline-earth elements while the inner layer is formed. The alkaline and alkaline-earth elements are gettered on an innermost portion of the inner layer which is later removed, leaving an inner layer with relatively few impurities. When used in a CZ-crystal growing process, the inner surface of the crucible remains smooth and substantially no bubbles grow in the inner layer.

11 Claims, 10 Drawing Sheets

METHODS FOR MAKING SILICA CRUCIBLES

BACKGROUND OF THE INVENTION

The present invention generally relates to crucible fabrication. Specifically, the present invention relates to methods and apparatus for making quartz glass crucibles that are suitable for use in pulling silicon single crystals for semiconductor applications.

There are several methods for making single crystal silicon materials. One such method—the "Czochralski" (CZ) method—has been widely adopted for producing single crystal silicon materials for semiconductor applications. In this method, polycrystalline silicon is melted in a vessel and a single-crystal seed crystal is dipped at its tip end portion into the molten silicon. The seed crystal is then "pulled" while being rotated so that a single crystal from the melt is grown on the seed crystal with the same crystallographic orientation.

A crucible is one vessel commonly employed in this pulling operation for making ingots of silicon single crystals. Crucibles are typically configured in a bowl shape, with walls and a bottom, to contain the molten silicon during the pulling operation. Crucibles may be made of any material which adequately contains the molten silicon without contaminating it, yet introduces a desired amount of oxygen into the molten silicon. One of the most widely used materials for such crucibles is silica or quartz glass.

These walls of the crucibles normally have double layer structures, with an inner layer and an outer layer. Normally, the outer layers of the crucibles are translucent—for increased scattering of the radiation from heater elements—and therefore contain numerous tiny bubbles. When the bubbles open during the crystal-pulling operation, however, they can damage the silicon ingots because any generated particle can travel from the bubble to melt-ingot interface and damage the crystal structure of the pulled ingot. To reduce this impact of bubbles in the outer layer, as well as for other reasons, the bubble-free inner layer is often formed between the outer layer and the melt.

The inner layer of the crucible wall should also as pure as possible to minimize the possibility of contamination of the ingot during the crystal-pulling operation. During the crystal-pulling process, portions of the inner layer can dissolve into the silicon melt. Silicon and oxygen, which are the main components of the inner layer, are not harmful to the silicon melt. Indeed, the dissolved oxygen—a main source of oxygen in the wafers cut from the ingot-acts as a mechanical strengthening element and as a gettering agent in the wafers. Other components such as impurities, however, are also transferred to the melt during the crystal-pulling operation.

One of the numerous methods known for preparing crucibles with inner layers which are substantially bubble-free is described in U.S. Pat. Nos. 4,416,680, 4,956,208, and 4,935,046, the disclosures of which are incorporated herein by reference. Other methods include those described in Japanese Patents JP1-197381 and JP1-197382 (which are modifications of the method described in U.S. Pat. No. 4,416,680), the disclosures of which are incorporated herein by reference. There are also numerous methods known for purifying the quartz grain used to make crucibles as well as electrolyzing finished crucibles, thereby making crucible walls with a "pure" inner layer. See, for example, respectively U.S. Pat. Nos. 5,637,284 and 4,874,417, the disclosures of which are incorporated herein by reference.

Despite the above efforts, currently available crucibles still have many problems. One important problem, as mentioned above, is the purity. Another important problem is that after running a long period, such as more than 100 hours, the inner surface of the crucible becomes rough. It is believed that the inner surface becomes rough either through merging of cristobalite rings formed on the inner surface during crystal pulling or through spot devitrification. When the inner surface becomes rough, the crystal structure of the ingot can suffer.

The semiconductor industry is moving towards larger wafer sizes. Consequently, the diameter of the ingots from which the wafers are cut must also be larger. But both of the problems mentioned immediately above become more pronounced as the size of the ingots becomes larger. To obtain larger diameter ingots, the CZ process must be run longer, increasing the possibility of the inner surface become rougher and more impurities dissolving into the melt from the inner layer of the crucible wall.

SUMMARY OF THE INVENTION

The present invention provides silica or quartz glass crucibles containing inner layers that are substantially pure and substantially bubble-free. When used in a CZ-crystal growing process, the inner layers of such crucibles are substantially stable against roughening and spot devitrification. The present invention also provides methods for making crucibles with these characteristics.

The inner layer is formed by a method which first forms a web structure using quick and high fusion power at the initial stage of fusing quartz grain to a silica glass crucible. The web structure is then converted to a continuous layer, thereby minimizing or eliminating bubble formation, bubble growth, surface roughening, and spot devitrification. The inner layer is also formed using a gettering agent which getters alkaline and alkaline-earth elements while the inner layer is formed. The alkaline and alkaline-earth elements are gettered on an innermost surface of the inner layer which is later removed, leaving an inner layer with relatively few impurities.

BRIEF DESCRIPTION OF THE DRAWINGS

One aspect of the present invention will be described in conjunction with FIGS. 1–10, where:

FIGS. 1–10 presented in conjunction with this description are views of only particular portions—rather than complete portions—of a silica crucible and an apparatus (and associated method) for making the same.

DETAILED DESCRIPTION OF THE INVENTION

The following description provides specific details in order to provide a thorough understanding of the present invention. The skilled artisan would understand, however, that the present invention can be practiced without employing these specific details. Indeed, the present invention can be practiced by modifying the illustrated crucibles and methods and can be used in conjunction with techniques conventionally used in the industry.

Figure 1:
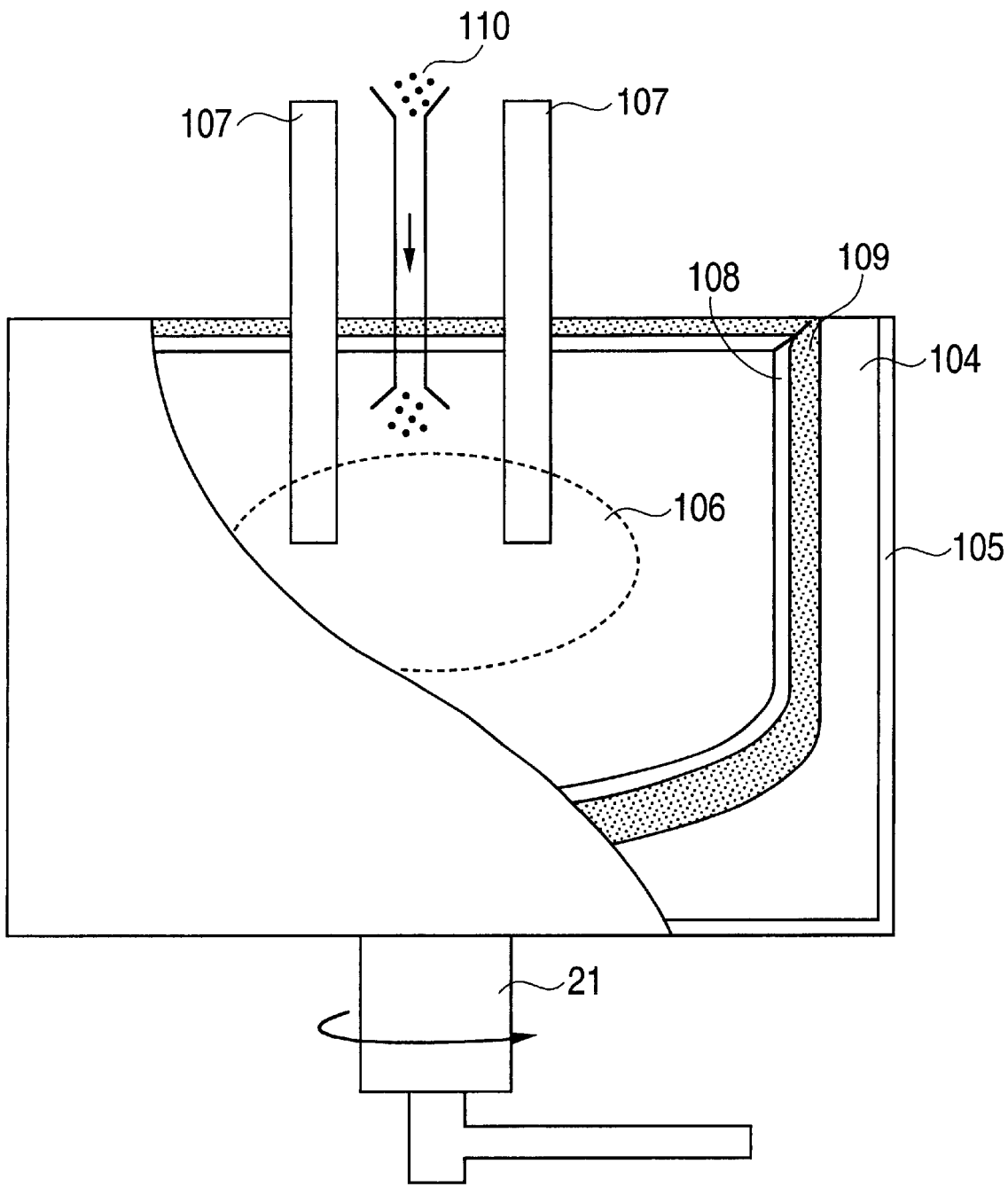
FIG. 1 is view of an apparatus and associated process for making silica crucibles according to the present invention.

The crucibles of the present invention can be made using any suitable apparatus known in the art. One suitable apparatus employs an electrical arc, such as described in U.S. Pat. No. 4,416,680, the disclosure of which is incorporated herein by reference. Another suitable apparatus is illustrated in FIG. 1. In FIG. 1, gas permeable mold 104 is installed in a vacuum-tight casing 105. The mold and casing rotate around a shaft 21 connected to an evacuation system through a rotary union. The grain 110 is supplied using any suitable means to the mold 104 and is fused by an electrical arc 106 created between electrodes 107.

The configuration and the size of mold 104 depends on the desired configuration and size of crucible 108 to be produced. Mold 104 may be made of any suitable material having a satisfactory heat resistance and mechanical strength, yet which may be formed into any desired configuration. Examples of suitable materials include stainless steel or graphite.

Crucible 108 is formed on the inner surface of mold 104 by any suitable process. One suitable process is described in U.S. Pat. No. 4,528,163, the disclosure of which is incorporated herein by reference. In this process, mold 104 is rotated about rotating shaft 21. High-purity silicon dioxide grain 110 is then supplied and directed toward the inner surface of mold 104. The grain is then heated to form the crucible 108, leaving unfused grain 109 between the crucible and the mold. Any suitable means known in the art for heating the grain can be used in the present invention, including the electrical arc discussed above.

The silica grain 110 supplied in the process of the present invention may be of any suitable size which will melt and form a crucible under the operating conditions. The grain may be crystalline, amorphous, or a mixture thereof and preferably is of a high purity so impurities in the crucible can be minimized. If desired, the grain can be purified before being supplied to the crucible-making operation by any suitable process known in the art. See, for example, U.S. Pat. No. 5,637,284, the disclosure of which is incorporated herein by reference.

In one aspect of the invention, the supplied grain 110 contains at least one gettering agent. The gettering agent, as described below, combines with other impurities in the inner layer during the process of making the inner layer of the crucible walls. The combined gettering agent and the impurities are later removed, thus increasing the purity of the inner layer. Any suitable gettering agent which accomplishes this function can be used in the present invention. Examples of suitable getting agents include aluminum-containing materials such as aluminum or aluminum oxide.

The concentration of the gettering agent in the supplied grain 110 depends on the amount needed to getter the desired impurities. In one aspect of the invention, such as when aluminum is used, the concentration of the gettering agent is greater than about 10 ppm, and preferably ranges from about 10 to about 15 ppm. The gettering agent can be automatically contained in the silica grain or can be added to the grain to obtain the desired concentration.

It is known in the art to obtain a low concentration of Al on the inner surface of the crucible by normal fusion of silica grain by an electrical arc, followed by etching the inner surface with HF acid. See, for example, Japanese Patent JP 63-166791, the disclosure of which is incorporated herein by reference. The crucibles formed by this method, however, are defective as they exhibit quick bubble evolution and growth in the inner layer.

To overcome this defect, the present invention makes an inner layer which exhibits little to no bubble growth. This advantage is achieved using the process of the present invention, which employs a large electrical power in a short time period during the fusion process. This electrical "burst" contributes to a high concentration of aluminum on an innermost portion of the inner layer. Thus, it is important to use aluminum—containing silica grain, preferably with an aluminum concentration higher than about 12 ppm.

Figure 2:
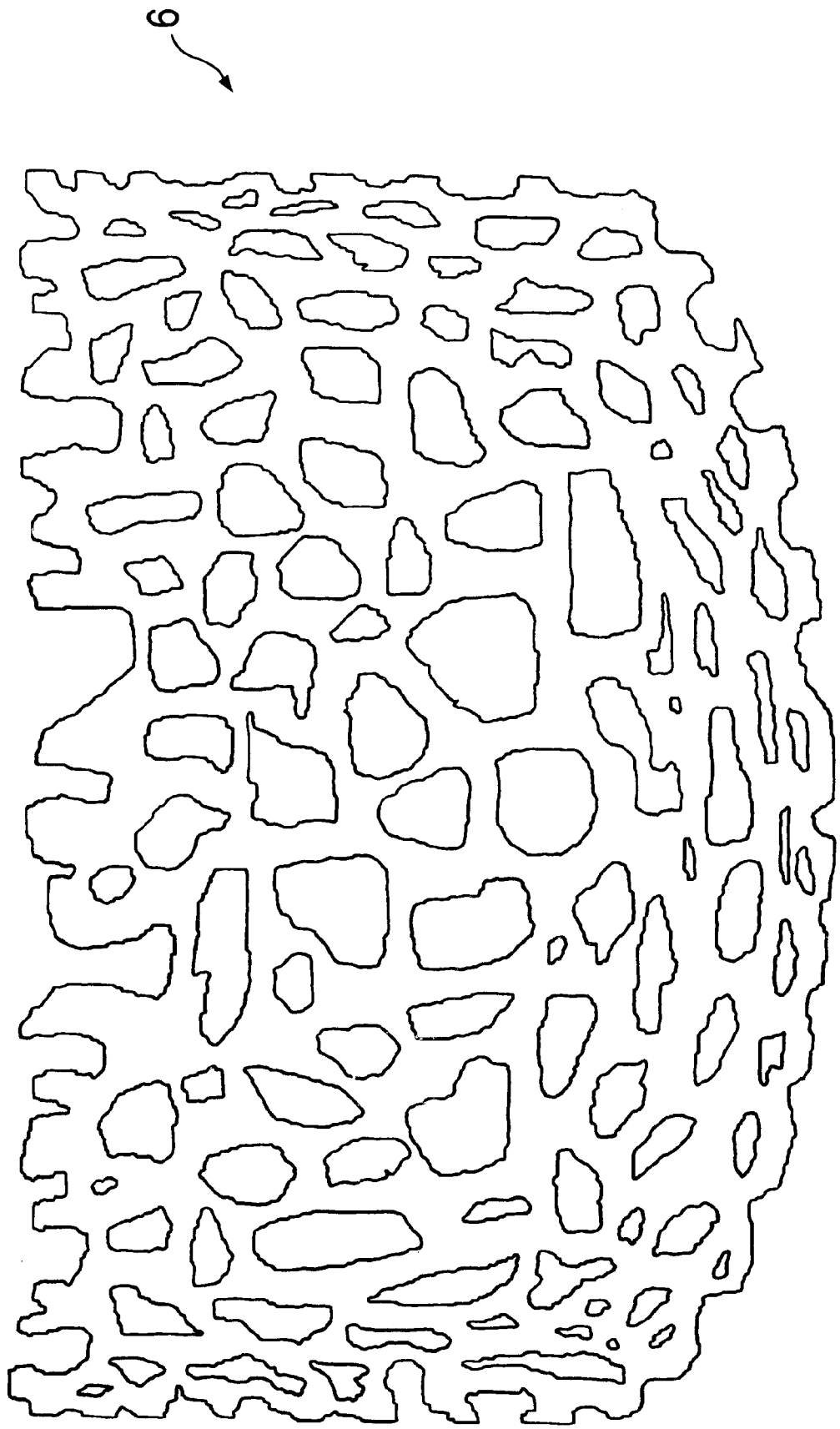
FIG. 2 is a view of a web structure formed during the process according to the present invention.

After the grain is supplied to the rotating mold, a quartz glass or silica web (or similar structure) is formed from the grain. An exemplary silica web 6 is illustrated in FIG. 2, where each string or strand of the web is connected to another strand. The silica web can be formed by any process which converts the quartz grain from a powder form to any partially continuous layer such as a web, lacework, lattice, mesh, or the like. In a preferred aspect of the invention, the silica web is formed by heating the grain quickly at a high power.

The quick heating process and high power fuses the grain into a silica web of low viscosity. Because of the surface tension of the fused silica, a substantially complete continuous layer is not formed at this stage. Rather, a web structure similar to that shown in FIG. 2 is formed provided that the power is quick enough and high enough. The web structure has a high surface to bulk ratio and a low viscosity, allowing the bubbles created during this stage to escape to the surface of the individual strings or strands of the web.

The speed and temperature of the heating and the power required in this conversion stage can be any combination which produces the desired web structure. In one aspect of the invention, the quartz grain is heated by an electric arc starting at a low power, e.g., a power of about 150 KVA. The power is then ramped to a higher power, e.g., a power ranging from about 500 KVA to about 900 KVA, depending on the diameter of the crucible. The ramping period can range from about 8 to about 30 seconds depending on the crucible size and the peak power value.

A higher power (i.e., more than about 900 KVA) or shorter ramping period (i.e., less than 8 seconds) may be acceptable depending on the size of the crucible. For example, the above ranges for the power and the ramping period are employed for crucibles with diameters ranging from about 14 to about 24 inches. If larger crucibles are made (i.e., a 40-inch crucible), the power needed may need to be higher (i.e., 1500 KVA) and ramp may be slower. Slower ramping, however, such as more than 30 seconds may not work to obtain the necessary silica web structure.

The amount of grain in mold 104 that is formed into the web structure is important. If too much of the grain 8 is formed into the web structure (which, as described below, is later converted into the inner layer), not enough grain will be left to sinter and form the outer layer of the crucible (as described below). Thus, only a selected inner portion of grain is converted to the web structure and the outer portion of grain is left in an unfused state. In one aspect of the invention, the web structure is formed on a substantially unfused grain bed.

Figure 3:
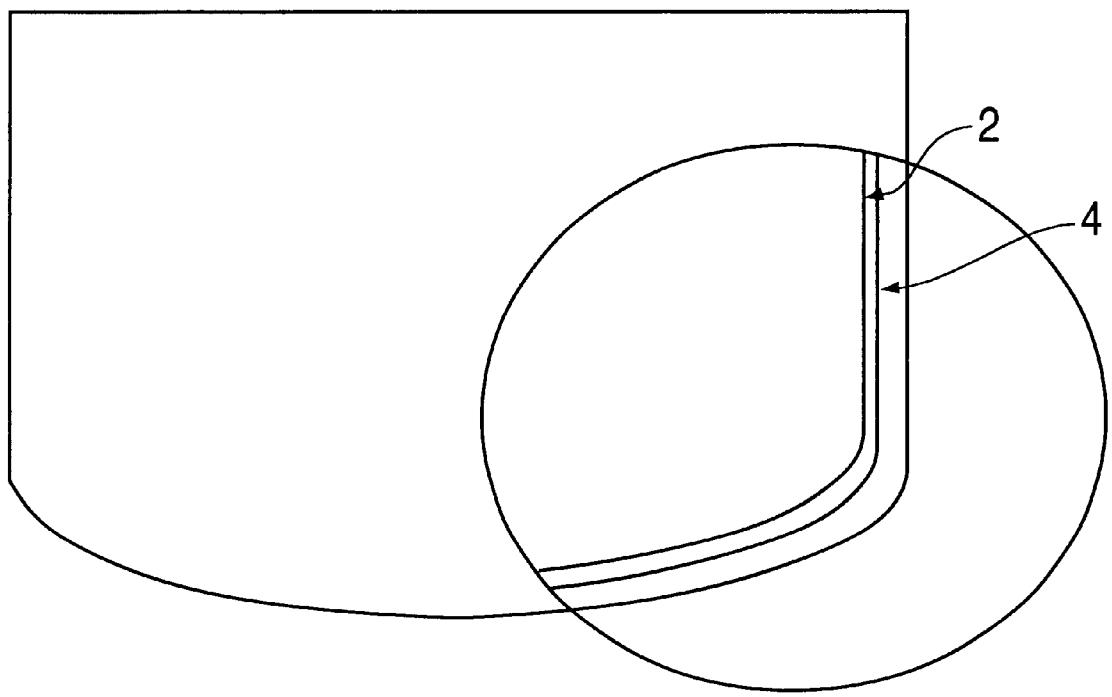
FIG. 3 is partial view of a silica crucible according to the present invention.
Figure 4:
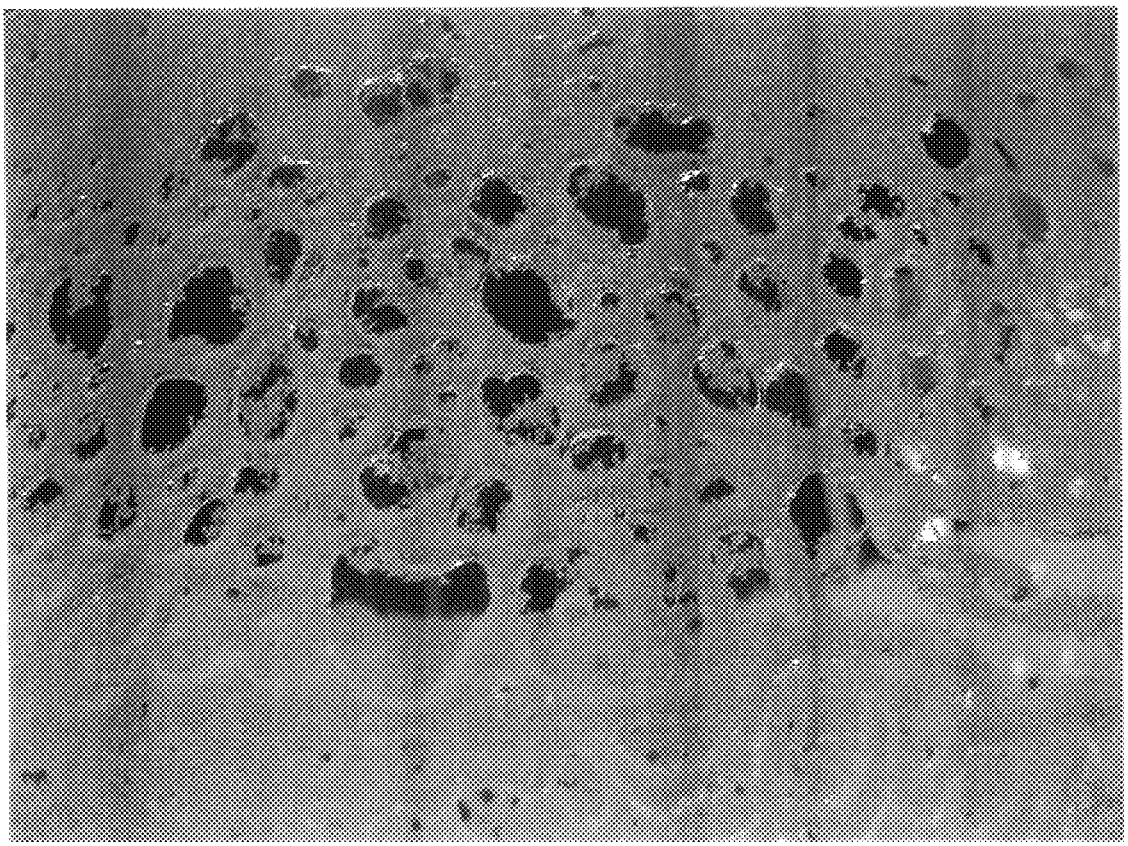
FIG. 4 is a photograph of a web structure formed during the process according to the present invention.
Figure 5:
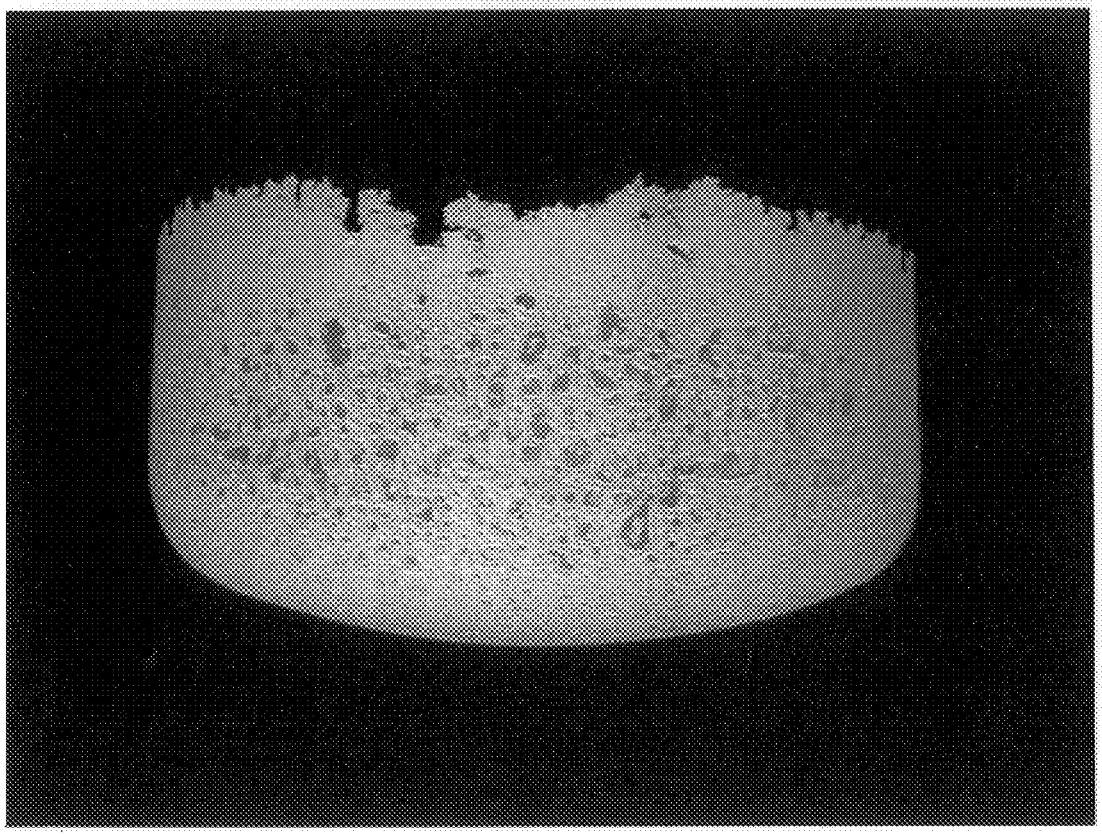
FIG. 5 is photograph of a crucible having web structure formed during the process according to the present invention.

Next, as shown in FIG. 3, the web structure is then converted to a substantially bubble-free, substantially continuous inner layer 2 depending on the mass of the silica web. The thickness of the inner layer 2 can be any suitable thickness known in the art, and is preferably about 2 mm.

The silica web can be converted to the substantially continuous layer through any suitable process which "fills in" the voids present between the strands in the web structure, e.g., through merging of the strands of the silica web. Since each individual strand is bubble-free and continues to remain bubble-free as the strands merge, the resulting inner layer also becomes essentially bubble-free. In one aspect of the invention, one suitable process for this conversion includes continuously heating the silica web. The continuous heating causes the merging of the individual strands in the web, thereby creating the substantially continuous layer. This continuous heating is usually carried out at a temperature ranging from about 2000° C. to about 2600° C. for about 10 to about 120 seconds.

Next, the outer quartz grain which has not been converted to the silica web (and then to the inner layer) is then fused into silica glass to form the outer layer 4 of the crucible as illustrated in FIG. 3. The outer quartz grain can be fused through any suitable process, such as a sintering process, which causes the individual grains to fuse together and form a continuous layer. This process is substantially similar to any of the known techniques to make bubble-containing crucibles. See, for example, U.S. Pat. No. 4,528,163, the disclosure of which is incorporated herein by reference.

Figure 8:
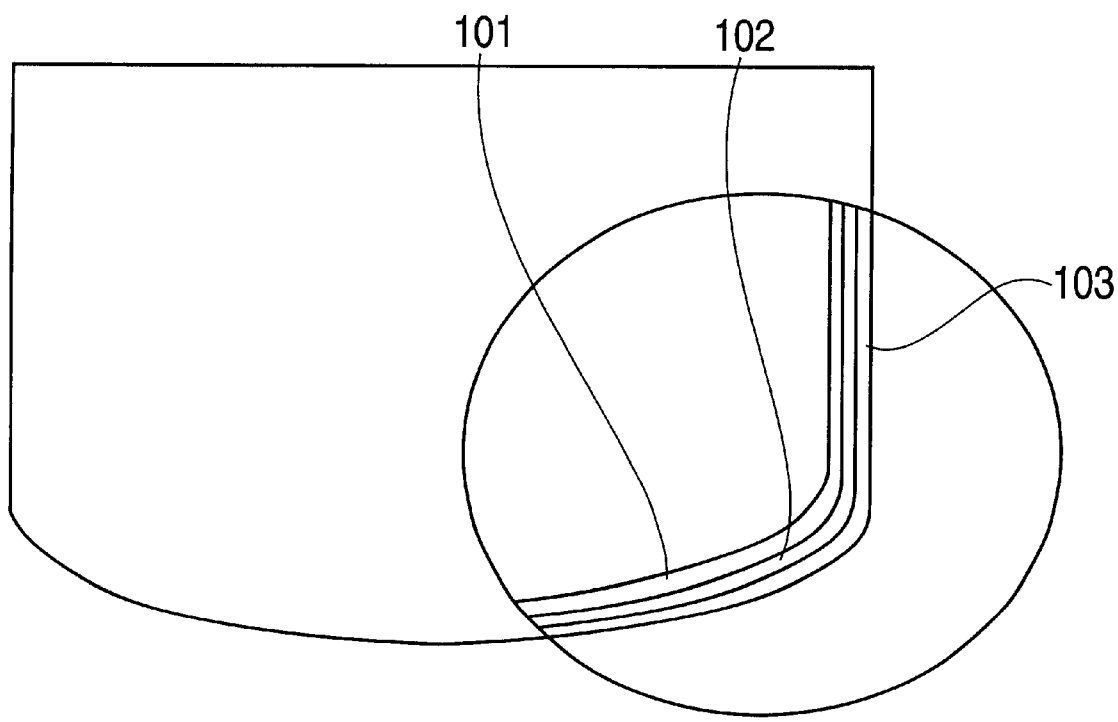
FIG. 8 is a partial view of a preferred silica crucible of the present invention.

Optionally, the above process can be modified slightly to obtain a three-layer crucible as illustrated in FIG. 8. In this process, the inner layer (converted from the silica web) is made on a known double—layer crucible. The double-layer crucible can be prepared by a controlled vacuum fusion process, which is described in JP1-197381. This controlled vacuum fusion process is a modification of the process for making a transparent crucible described in U.S. Pat. No. 4,416,680. As the crucible is made by fusing the grain, layer by layer from the inside to the outside, a transparent-translucent double-layer crucible can be made by stopping the vacuum intermediate of the total fusion cycle.

In one aspect of the method of the present invention, a very high and quick heating is used to make the web structure. Because the web structure is open to gas flow, a vacuum is not applied to the fused silica glass. After obtaining the continuous inner layer 101, which is a no bubble growth layer, from the web structure, a vacuum is applied to make a transparent layer 102 beneath the inner layer 101. The transparent layer 102 fused under the vacuum exhibits bubble growth. Thus, a bubble-growth transparent layer 102 is covered by a no-bubble-growth transparent layer 101. Then, stopping the vacuum and continuing the heating yields the translucent outer layer 103.

As described above, high temperatures are used during the heating stages used to form the inner layer 2 or 101. At these high temperatures, silica sublimates from the surface of the inner layer of the crucible. Aluminum in the form or aluminum oxide (alumina), however, is very stable at such high temperatures and does not sublime as quick as silica, thus remaining in the inner layer. As the silica sublimates near the bulk surface, the concentration of aluminum near the surface increases while the concentration of silica decreases.

Figure 9:
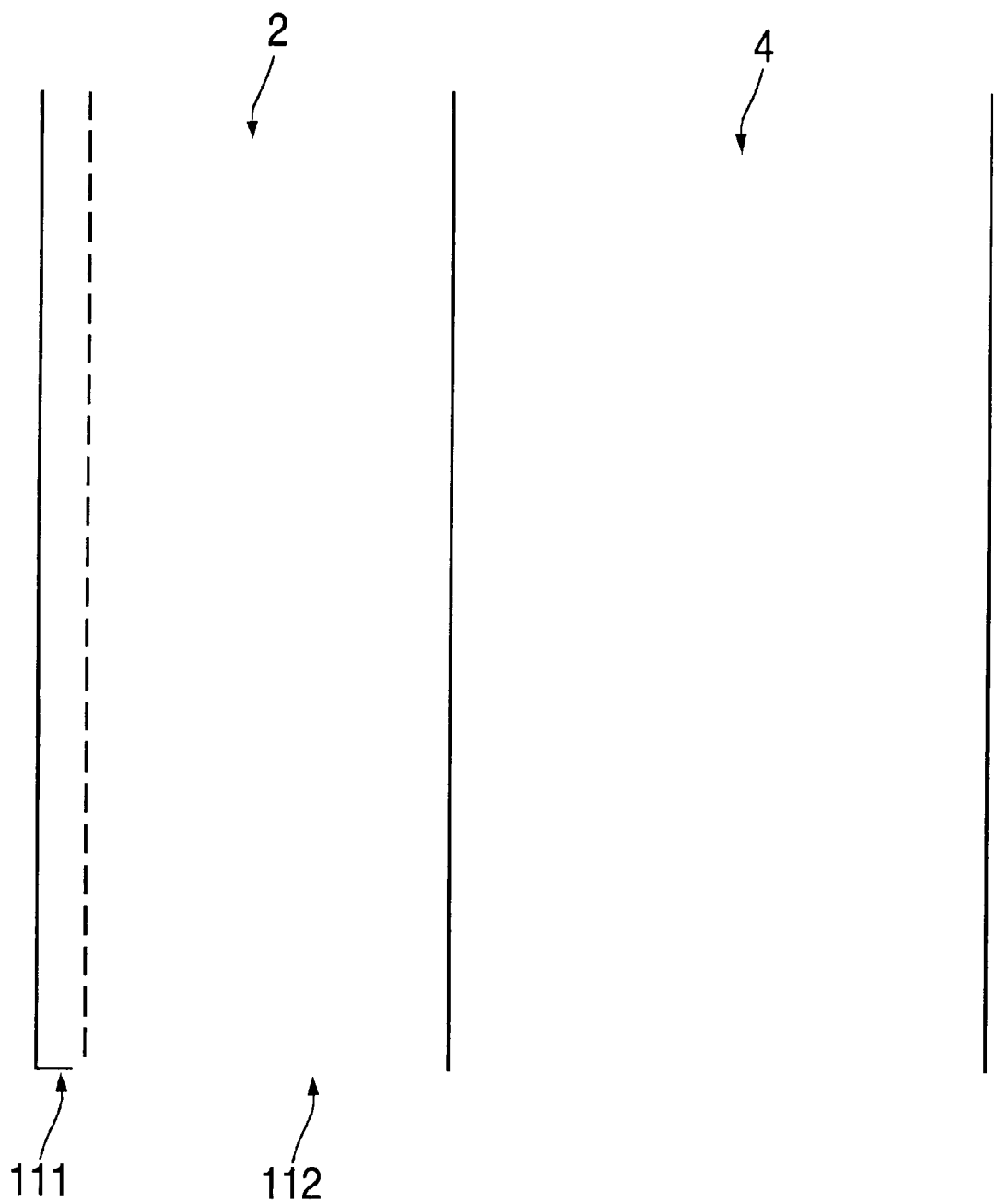
FIG. 9 is a detailed view of a portion of a crucible wall of the present invention.
Figure 10:
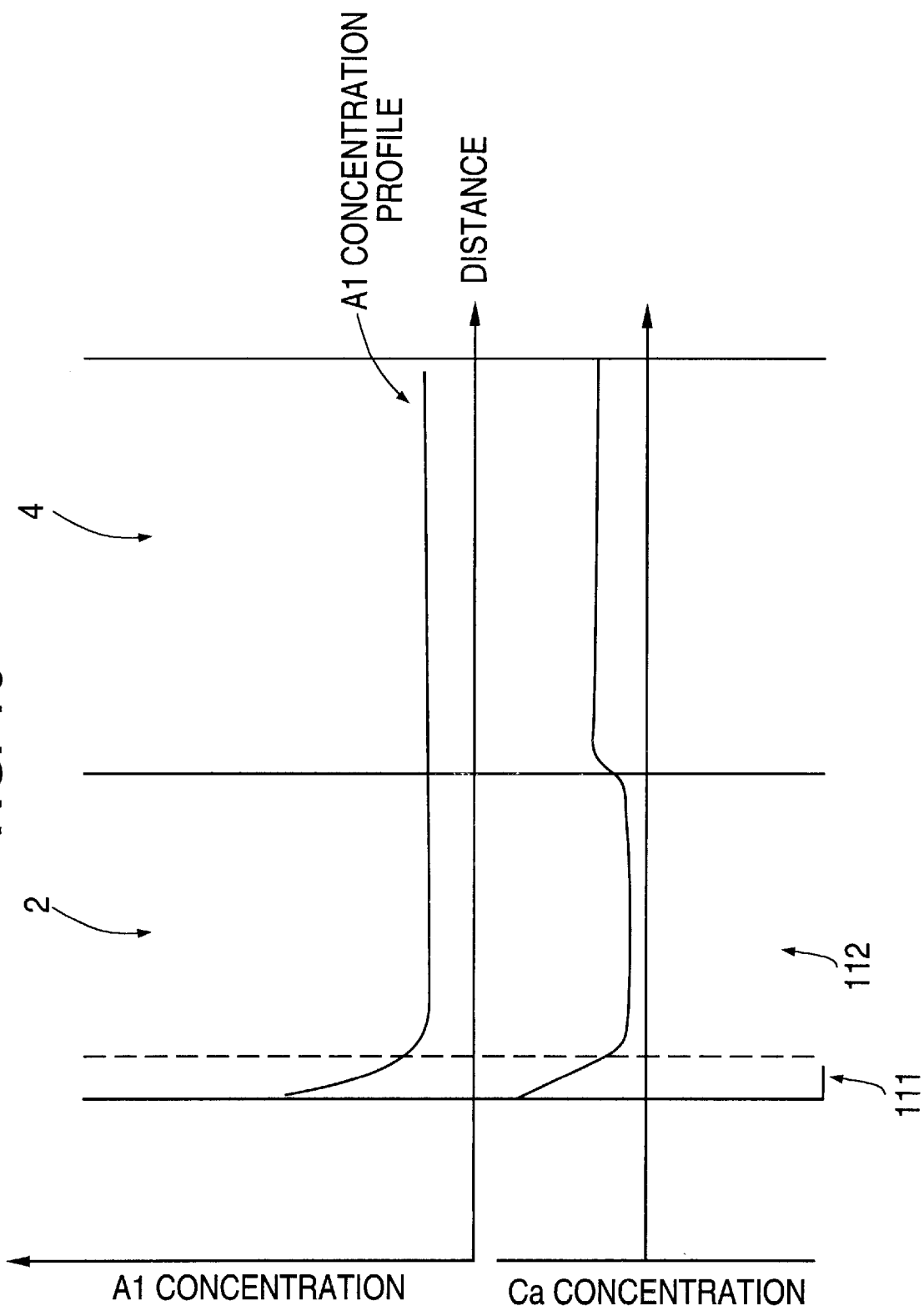
FIG. 10 is a view showing an example of the aluminum and calcium concentration in a portion of a crucible wall of the present invention.

This sublimation results in two layers (or regions) in inner layer 2: an aluminum-rich innermost layer 111 and a bulk inner layer 112 as illustrated in FIG. 9. In one aspect of the present invention, the concentration of the aluminum ranges from about 40 ppm to about 200 ppm, on average, when the innermost layer 111 is about 100 micrometers in thickness. The concentration of Al, of course, varies over the distance of the crucible wall and is higher the closer to the innermost surface of the inner layer. A representative profile of the Al concentration in the crucible wall is depicted in FIG. 10.

As known in the industry, Al atoms in silica glass attract atoms of alkaline elements, e.g., Li, Na, K, Rb, Cs, and Fr. Al atoms are relatively immobile in silica while atoms of alkaline elements are relatively mobile at high temperatures. The atoms of the alkaline elements are trapped by the Al atoms to form a complex. In this manner, the atoms of the alkaline elements can be gettered by the Al atoms. It is believed that the aluminum atoms also combine with atoms of the alkaline-earth elements, including Ca and Mg, to form additional complexes. These alkaline and alkaline-earth elements are often detrimental because they can accelerate degradation of the crucible.

By combining with the alkaline and alkaline-earth elements, the aluminum (as a gettering agent) getters these impurities from the inner layer. Thus, this gettering process modifies the impurity concentration of the inner layer 2. As described above, the concentration of the aluminum is higher in the innermost layer 111 because of the silica sublimation. Some of the alkaline and alkaline-earth elements in the bulk layer 112 migrate to the innermost layer 111 to combine with Al to form complexes. Thus, the alkaline and alkaline-earth elements are partially removed from the bulk layer 112 and trapped in the Al-rich innermost layer 111. Consequently, the relative concentration of the alkaline and alkaline-earth elements in the innermost layer 111 becomes higher and correspondingly lower in bulk layer 112. Representing alkaline and alkaline-earth group impurities, the calcium concentration profile is schematically depicted in FIG. 10.

Next, the crucible is cooled by any suitable process known in the art. Then, the crucible is measured for the desired size and cut by any suitable process known in the art.

Finally, the aluminum-rich and impurity-rich innermost layer of the inner layer is removed, leaving an inner layer with a relatively low concentration of impurities. Any desired thickness of the innermost layer can be removed by the process, but should be limited to that portion of the inner layer containing the higher concentration of Al and alkaline and alkaline-earth elements. In one aspect of the invention, about 60 micrometers of the inner surface is removed. But a larger and/or smaller thickness can be removed, if desired.

This inner surface can be removed by any suitable process which removes the Al-rich innermost layer leaving the remaining portion of the inner layer. Suitable processes include mechanical processes like sand-blasting or chemical processes like etching processes. In a preferred aspect of the invention, the Al-rich innermost layer is removed by an etching process, such as a chemical etch with an acid. For example, for a Al-rich innermost layer with a thickness of about 60 micrometers, the etch can be performed with about 50% HF for more than 15 minutes or at about 25% HF for more than 300 minutes. Other concentrations and durations, of course, can be used depending on the thickness desired to be removed. Optionally, other additives or agents can be used in the etching process to aid in the etching process. For example, an inorganic acid such as nitric acid may be added to remove other metallic impurities.

After the removal process, the crucible is rinsed, dried, and packaged by any suitable process known in the art.

The process described above yields silica crucible having a substantially pure, substantially bubble-free inner layer which remains substantially bubble-free during use. This inner layer maintains a substantially smooth surface during prolonged time of reaction with molten silicon, such as the increased time needed to make larger size wafers. Further, the resulting inner layer from the above process has fewer devitrification spots because—it is believed—the inner layer contains fewer devitrification agents, such as alkaline and alkaline-earth elements.

The following non-limiting examples illustrate the present invention.

EXAMPLE 1

Natural quartz grain was obtained and then purified by hydrochloric gas at 1100 degree C. in a rotary kiln. The purity of the processed grain is reported in Table 1. The grain was poured in a vertically rotating mold as illustrated in FIG. 1. Starting with 150 KVA, the power was then ramped to 900 KVA in 12 seconds.

The heating was then continued at 750 KVA under a vacuum of about 350 torr until the silica web structure was converted to a transparent, inner layer with a thickness of about 2 mm shown as 101 in FIG. 8. Then, the inner part of the outer layer was sintered under a vacuum to make another bubble-free layer 102 (see FIG. 8). The vacuum was stopped while the heating was continued at 450 KVA for 240 seconds to form a bubble-containing outer layer 103 (see FIG. 8) on the outside of the transparent layer. When the fusion cycle was complete, a three-layer crucible was present with unfused quartz grain left between the crucible and the mold.

The inner surface of the inner layer of the crucible was then etched with 50% HF solution for 15 minutes. The metallic impurities and Si concentration in the etching solution after etching were analyzed. By normalization procedures using the Si concentration, it was determined that the etched off layer had an Al concentration of 90 ppm, as well as the concentrations of Li, Na, Ca, and Mg reported in Table 1.

Figure 6:
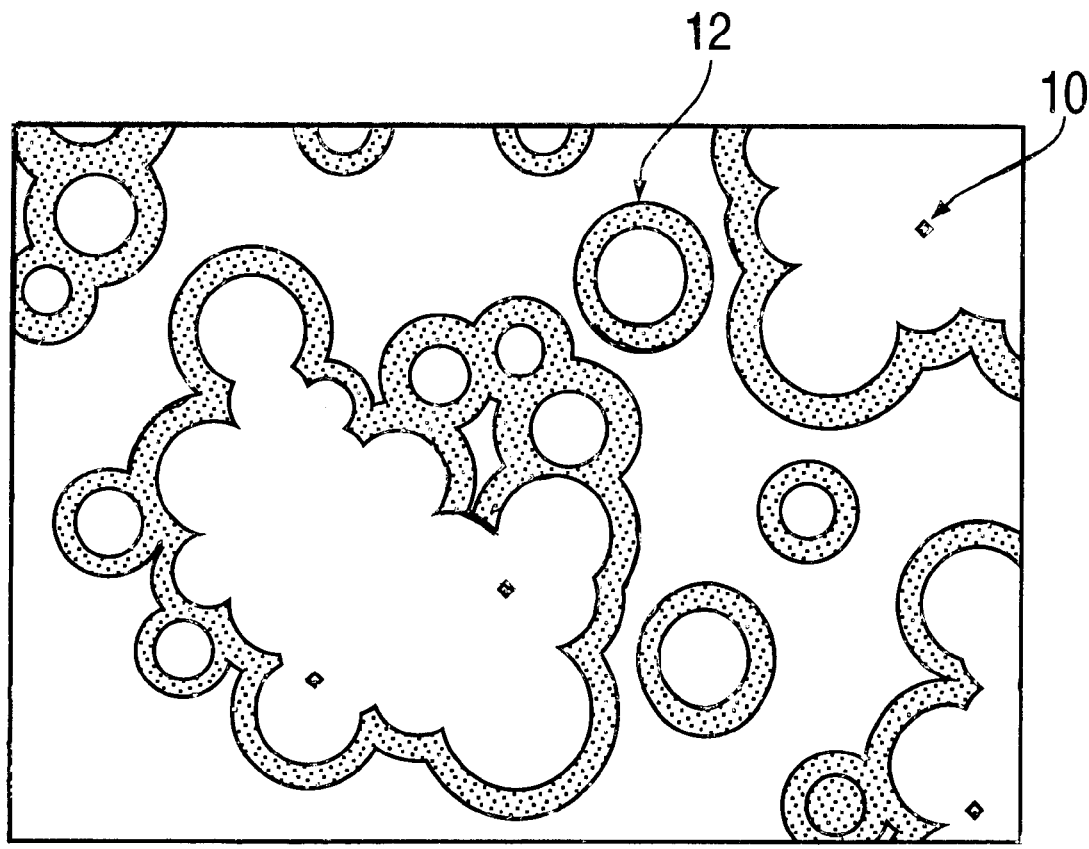
FIG. 6 is a view of an inner surface of a used crucible made according to the present invention.

The crucible thus obtained was used in a CZ-pulling process for 120 hours, and the inner surface which had contacted the silicon melt was then observed. The amount of cristobalite rings 12 and devitrification spots 10 present are illustrated in FIG. 6.

EXAMPLE 2

Natural quartz grain was obtained and then purified by hydrochloric gas at 1100 degree C. in a rotary kiln. The purity of the processed grain is reported in Table 1. The grain was poured in a vertically rotating mold similar to the one illustrated in FIG. 1, except for the connection to the vacuum system. Starting with 150 KVA, the power was then ramped to 900 KVA in 12 seconds.

The heating was then continued at 750 KVA until the silica web structure was converted to a transparent, inner layer with a thickness of about 2 mm. The heating was continued at 450 KVA for 240 seconds to form a bubble-containing outer layer. When the fusion cycle was complete, a two-layer crucible was present with unfused quartz grain left between the crucible and the mold.

The inner surface of the inner layer crucible was then etched with 50% HF solution for 15 minutes. The metallic impurities and Si concentration in the etching solution after etching were analyzed. By normalization procedures using the Si concentration, it was determined that the etched off layer had an Al concentration of 90 ppm, as well as the concentrations of Li, Na, Ca, and Mg reported in Table 1.

The crucible thus obtained was used in a CZ-pulling process for 120 hours, and the inner surface which had contacted the silicon melt was then observed. The amount of cristobalite rings 12 and devitrification spots 10 present are similar to that illustrated in FIG. 6.

EXAMPLE 3

Natural quartz grain was obtained and then purified by hydrochloric gas at 1100 degree C. in a rotary kiln. The purity of the processed grain is reported in Table 1. The grain was poured in a vertically rotating mold as illustrated in FIG. 1.

Starting with 100 KVA, the power was then ramped to 450 KVA and maintained for 180 seconds to fuse the grain and make a bubble-containing layer. Then, 2 kg of grain was supplied at the rate of 200 gram per minute into the arc to deposit the grain and form a 1.3 mm bubble-free inner layer on the bubble-containing layer.

The inner surface of the crucible was then etched with 10% HF solution for 15 minutes. The metallic impurities and Si concentration in the etching solution after etching were analyzed. By normalization procedures using the Si concentration, it was determined that there was a small decrease in the Li concentration, but otherwise the purity has not substantially changed from that in the starting material.

Figure 7:
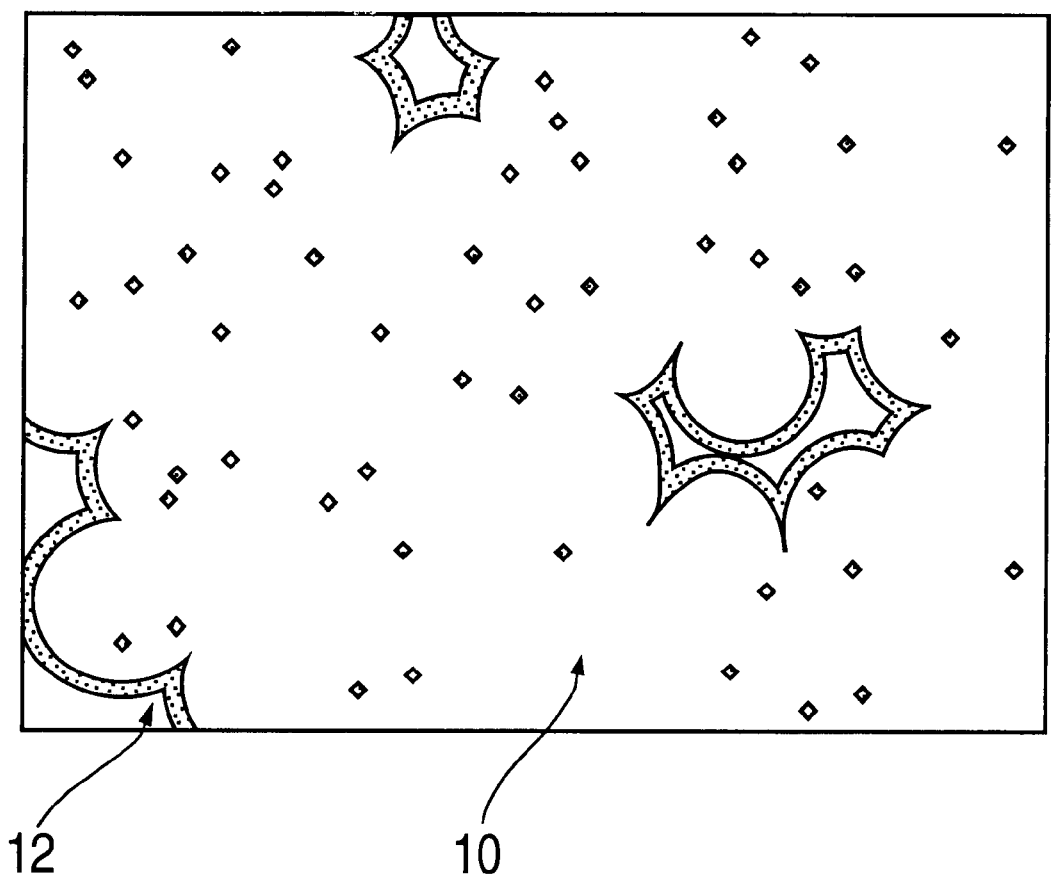
FIG. 7 is a view of an inner surface of a used crucible made according to a conventional process.

The crucible thus obtained was used in a CZ-pulling process for 90 hours, and the inner surface contacted with the melt was then observed. The inner surface was almost covered by merged cristobalite rings 12 and many devitrification spots 10, as shown in FIG. 7. The inner surface was also rough with small wavy irregularities.

TABLE 1

|  | Al (ppm) | Li (ppm) | Na (ppm) | Ca (ppm) | Mg (ppm) |
| --- | --- | --- | --- | --- | --- |
| Quartz Grain | 10 | 1.0 | <0.1 | 1.5 | 0.2 |
| Innermost Layer | 90 | 1.8 | 0.5 | 2.4 | 0.3 |
| Inner Layer: Ex. 1, 2 | 10 | 0.2 | <0.1 | 0.6 | <0.2 |
| Inner Layer: Example 3 | 10 | 0.7 | <0.1 | 1.5 | 0.2 |

Having thus described in detail the preferred embodiments of the present invention, it is to be understood that the invention defined by the appended claims is not to be limited by particular details set forth in the above description, as many apparent variations thereof are possible without departing from the spirit or scope thereof.

We claim:

1. A method for making a silica crucible, comprising:
   providing a silica web structure containing a gettering agent;
   converting the web structure to a substantially continuous inner layer so an innermost portion of the inner layer contains a portion of the gettering agent;
   providing an outer layer; and
   removing the innermost portion.

2. The method of claim 1, wherein the gettering agent comprises aluminum.

3. The method of claim 2, wherein the concentration of aluminum is greater than about 10 ppm.

4. The method of claim 1, wherein the gettering agent getters alkaline and alkaline earth group impurities.

5. The method of claim 1, including providing the inner layer by forming a silica web structure and then converting the structure to a substantially continuous layer.

6. The method of claim 5, including forming the silica web structure by providing quartz grain containing the gettering agent in a rotating mold and quickly heating an inner portion of the grain at a high power.

7. The method of claim 6, where the heating is performed for about 8 to about 30 seconds at a power ranging from about 500 KVA to about 900 KVA.

8. The method of claim 5, including converting the web structure by heating until the strands of the web structure are substantially merged.

9. The method of claim 6, including providing the outer layer by sintering the outer portion of the grain in the rotating mold.

10. The method of claim 1, including removing the inner portion of the inner layer by an etching process.

11. The method of claim 10, wherein the etching process uses HF acid.

* * * * *